US011329218B2

(12) United States Patent
Yang et al.

(10) Patent No.: US 11,329,218 B2
(45) Date of Patent: May 10, 2022

(54) MULTIPLY SPIN-COATED ULTRA-THICK HYBRID HARD MASK FOR SUB 60NM MRAM DEVICES

(71) Applicant: Taiwan Semiconductor Manufacturing Company, Ltd., Hsinchu (TW)

(72) Inventors: Yi Yang, Fremont, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 318 days.

(21) Appl. No.: 16/728,099

(22) Filed: Dec. 27, 2019

(65) Prior Publication Data

US 2020/0136030 A1    Apr. 30, 2020

Related U.S. Application Data

(63) Continuation of application No. 15/899,086, filed on Feb. 19, 2018, now Pat. No. 10,522,750.

(51) Int. Cl.
*H01L 43/12* (2006.01)
*G11C 11/16* (2006.01)
(Continued)

(52) U.S. Cl.
CPC .............. *H01L 43/12* (2013.01); *G11C 11/15* (2013.01); *G11C 11/161* (2013.01);
(Continued)

(58) Field of Classification Search
CPC ....... H01L 43/12; H01L 27/222; H01L 43/08; H01L 21/0337; G11C 11/15; G11C 11/161

See application file for complete search history.

(56) References Cited

U.S. PATENT DOCUMENTS 3,615,937 A  10/1971 Collins et al.
8,673,789 B2  3/2014 Kim
(Continued)

FOREIGN PATENT DOCUMENTS

TW    201351739    12/2013
TW    201638996    11/2016
(Continued)

OTHER PUBLICATIONS

European Search Report dated Aug. 7, 2019, Application No. 19157883.0, 7 pages.

*Primary Examiner* — Mounir S Amer
*Assistant Examiner* — Alexander Belousov
(74) *Attorney, Agent, or Firm* — Haynes and Boone, LLP

(57) ABSTRACT

A metal hard mask layer is deposited on a MTJ stack on a substrate. A hybrid hard mask is formed on the metal hard mask layer, comprising a plurality of spin-on carbon layers alternating with a plurality of spin-on silicon layers wherein a topmost layer of the hybrid hard mask is a silicon layer. A photo resist pattern is formed on the hybrid hard mask. First, the topmost silicon layer of the hybrid hard mask is etched where is it not covered by the photo resist pattern using a first etching chemistry. Second, the hybrid hard mask is etched where it is not covered by the photo resist pattern wherein the photoresist pattern is etched away using a second etch chemistry. Thereafter, the metal hard mask and MTJ stack are etched where they are not covered by the hybrid hard mask to form a MTJ device and overlying top electrode.

20 Claims, 2 Drawing Sheets

(51) Int. Cl.
*H01L 27/22* (2006.01)
*H01L 43/08* (2006.01)
*G11C 11/15* (2006.01)
*H01L 21/033* (2006.01)

(52) U.S. Cl.
CPC ............ *H01L 27/222* (2013.01); *H01L 43/08* (2013.01); *H01L 21/0332* (2013.01); *H01L 21/0337* (2013.01)

(56) References Cited

U.S. PATENT DOCUMENTS

| | | |
|---|---|---|
| 8,975,088 B2 * | 3/2015 | Satoh .................... H01L 43/12 438/3 |
| 2002/0081854 A1 | 6/2002 | Morrow et al. |
| 2004/0198037 A1 * | 10/2004 | Iba .................. H01L 21/31144 438/634 |
| 2006/0131754 A1 | 6/2006 | Ohtake et al. |
| 2007/0243707 A1 | 10/2007 | Manger et al. |
| 2010/0311243 A1 | 12/2010 | Mao |
| 2011/0250757 A1 | 10/2011 | Sukekawa et al. |
| 2016/0351791 A1 | 12/2016 | Zou et al. |
| 2016/0351799 A1 | 12/2016 | Xue et al. |

FOREIGN PATENT DOCUMENTS

| | | |
|---|---|---|
| WO | WO2004/012246 | 2/2004 |
| WO | WO2015/115002 | 8/2015 |

* cited by examiner

MULTIPLY SPIN-COATED ULTRA-THICK HYBRID HARD MASK FOR SUB 60NM MRAM DEVICES

PRIORITY DATA

The present application is a continuation application of U.S. patent application Ser. No. 15/899,086, filed Feb. 19, 2018, which is incorporated by reference herein in its entirety.

TECHNICAL FIELD

This application relates to the general field of magnetic tunneling junctions (MTJ) and, more particularly, to etching methods for forming sub 60 nm MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE) or their combination are usually involved. During photolithography, patterns are transferred from a photomask to a light-sensitive photoresist, and later on transferred to MTJ stacks by RIE, IBE or their combination, forming separate and non-interacting MTJ devices. The hard mask during etch needs to be thick enough for excellent pattern integrity, especially for sub 60 nm devices.

One widely used low cost hybrid mask stack in the integrated circuit (IC) industry is composed of a thin (~30 nm) spin-coated silicon hard mask on top of a thick (100-150 nm) spin-coated carbon hard mask. First, the thin silicon hard mask can be etched by fluorine carbon plasma, using a thin (lower than 200 nm) and high-quality photoresist pattern mask. The thick carbon hard mask can then be etched by 02 based plasma which has a very low etch rate on the thin silicon hard mask above. To improve the future sub 60 nm MRAM device yield and variation, it is critical to enhance the process margin and one of the solutions is to thicken the carbon hard mask so that one can increase the thickness of the metal hard mask (top electrode) on top of the MTJ. This is important because a thick metal hard mask would provide enough protection for the later MTJ etch as well as better CMP polish control. However during spin-coating, the film thickness is controlled by revolutions per minute (RPM). Fewer RPM results in a thicker film, but the RPM cannot be too low, otherwise the film would be non-uniform. If carbon is directly spin-coated twice, part of the underneath carbon film would be dissolved, causing material loss and film quality degradation. A novel way to efficiently spin-coat a thick carbon hard mask is therefore needed.

Several patents teach using more than one hard mask layer including: U.S. Patent Applications 2007/0243707 (Manger et al) and 2016/0351791 (Zou et al) and U.S. Pat. No. 8,673,789 Kim) and U.S. Pat. No. 8,975,088 (Satoh et al). All of these references are different from the present disclosure.

SUMMARY

It is an object of the present disclosure to provide an improved method of forming MTJ structures having a thick metal top electrode.

Yet another object of the present disclosure is to provide a method of forming MTJ structures having a thick metal top electrode by using a thick hybrid hard mask stack.

In accordance with the objectives of the present disclosure, a method for etching a magnetic tunneling junction (MTJ) structure is achieved. A MTJ stack is provided on a substrate. A metal hard mask layer having a first thickness is deposited on the MTJ stack. A dielectric hard mask is deposited on the metal hard mask. A hybrid hard mask is formed on the dielectric hard mask layer, comprising a plurality of spin-on carbon layers alternating with a plurality of spin-on silicon layers wherein a topmost layer of the hybrid hard mask is a silicon layer. A photo resist pattern is formed on the hybrid hard mask. First, the topmost silicon layer of the hybrid hard mask is etched where is it not covered by the photo resist pattern using a first etching chemistry. Second, the hybrid hard mask is etched where it is not covered by the photo resist pattern wherein the photoresist pattern is etched away using a second etch chemistry. Thereafter, the dielectric hard mask, metal hard mask, and MTJ stack are etched where they are not covered by the hybrid hard mask to form a MTJ device and overlying top electrode having a MTJ pattern size between about 20 and 30 nm wherein the metal hard mask layer remaining has a second thickness no less than 80% of the first thickness.

Also in accordance with the objectives of the present disclosure, a method for etching a magnetic tunneling junction (MTJ) structure is achieved. A MTJ stack is provided on a substrate. A metal hard mask layer is deposited on the MTJ stack. A hybrid hard mask is formed on the metal hard mask layer comprising: a) spin-coating a first carbon layer, b) spin-coating a first silicon layer on the first carbon layer, and c) spin-coating a second carbon layer on the first silicon layer. A topmost silicon layer is spin-coated on the second carbon layer. Optionally, d) a second silicon layer is spin-coated on the second carbon layer, and e) a third carbon layer is spin-coated on the second silicon layer. In this case, the topmost silicon layer is spin-coated on the third carbon layer. A photo resist pattern is formed on the hybrid hard mask wherein the photo resist pattern has a first pattern size. The topmost silicon layer is first etched where it is not covered by the photo resist pattern wherein after etching, the photo resist pattern and the topmost silicon layer have a second pattern size smaller than the first pattern size. Thereafter, the remaining hybrid hard mask is etched wherein after this second etching, the photo resist pattern has been removed and the hybrid hard mask has a third pattern size smaller than the second pattern size. Thereafter, the metal hard mask and the MTJ stack are etched where they are not covered by the hybrid hard mask to form a MTJ device and overlying top electrode having a MTJ pattern size smaller than the third pattern size.

BRIEF DESCRIPTION OF THE DRAWINGS

In the accompanying drawings forming a material part of this description, there is shown.

DETAILED DESCRIPTION

In this disclosure, we develop a hybrid hard mask the thickness of which can easily be increased to 200 nm and above by alternately spin-coating a thick carbon hard mask and a thin silicon hard mask onto each other. There is no material loss since these two materials' solvents do not dissolve each other. Therefore the total hard mask thickness is no longer limited by the spin-coating RPM. By optimizing the etch chemistry, the etch selectivity is tuned to match these two materials' composition in this hybrid hard mask stack, allowing for high quality patterns. It thus becomes possible to define a thick metal hard mask for sub 60 nm MRAM devices with a large process margin.

In the IC industry's existing process, only a single layer of a carbon hard mask is spin-coated. Its maximum thickness is usually less than 150 nm, limited by the lowest spin-coating RPM that still delivers a uniform film. However, in the process of the present disclosure, we alternately spin-coat the thin silicon and thick carbon hard masks so that an ultra-thick hybrid hard mask stack over 200 nm is possible. Decoupling the original spin-coating into several steps is the key to this method's success.

The schematic process flow of the multiply spin-coated hybrid hard mask of the present disclosure is shown in FIGS. 1-4. FIGS. 1A and 1B illustrate two preferred embodiments of the hybrid hard mask of the present disclosure.

Figure 1A:
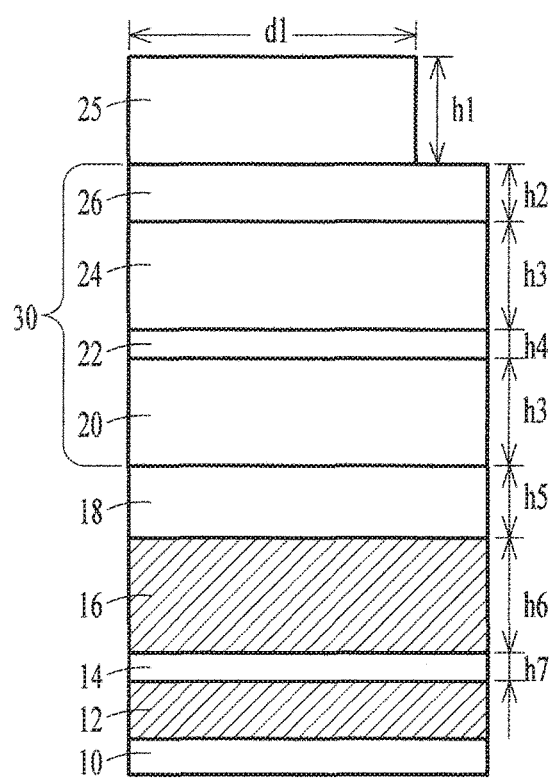
FIG. 1A illustrates a cross-sectional representation of a first preferred embodiment of a hybrid hard mask of the present disclosure.

The first preferred embodiment of the present disclosure will be described with reference to FIG. 1A. FIG. 1A illustrates a bottom electrode layer 12 formed on a semiconductor substrate 10. Next, the MTJ film layers are deposited, typically including a seed layer, a pinned layer, a barrier layer, a free layer, and a cap layer, for example. These layers form the MTJ film stack 14, having a thickness h7 of between about 10 and 30 nm.

On top of MTJ stack 14, a metal hard mask 16 such as Ta, Ti, TaN or TiN is deposited, preferably to a thickness h6 of greater than or equal to 60 nm. The hard mask will form the top electrode after etching is complete.

Now, a silicon oxynitride (SiON) layer 18 is deposited by chemical vapor deposition (CVD) to a thickness h5 of between about 80 and 110 nm. This layer will optimize the pattern size and uniformity.

Next, a hybrid hard mask stack is sequentially spin-coated onto the SiON hard mask 18. A first spin-on carbon (SOC) layer 20 is spin-coated onto the stack to a thickness h3 of between about 100 and 150 nm. A first silicon hard mask 22 is spin-coated onto the first SOC layer to a thickness h4 of between about 10 and 15 nm. A second SOC layer 24 is spin-coated onto the first silicon hard mask 22 to the same thickness h3 as the first SOC layer. A second silicon hard mask 26 is spin-coated onto the second carbon layer 24 to a thickness h2 of between about 30 and 60 nm. This completes the hybrid hard mask stack 30A.

Figure 1B:
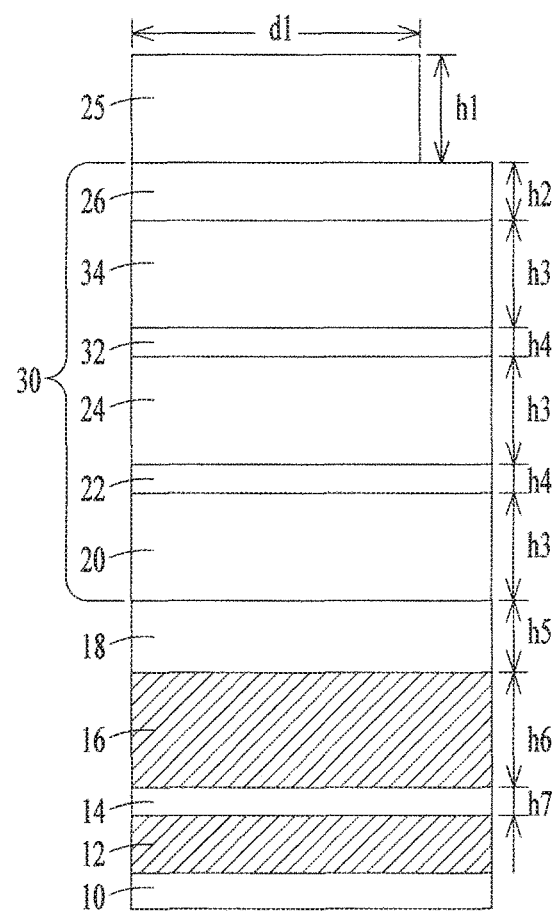
FIG. 1B illustrates a cross-sectional representation of a second preferred embodiment of a hybrid hard mask of the present disclosure.

In the second preferred embodiment of the present disclosure, if an even thicker top electrode 16 and MTJ 14 are desired, an additional silicon hard mask and carbon hard mask can be spin-coated to form a thicker hybrid hard mask. FIG. 1B illustrates the alternative hybrid hard mask 30B. An additional silicon hard mask 32 having a thickness h4 of between about 10 and 15 nm is spin-coated on second carbon layer 24. An additional third carbon layer 34 having a same thickness h3 as the other carbon layers is spin-coated on the additional silicon layer 32. Topmost silicon layer 26 is then spin-coated onto the third carbon layer 34 to a thickness h2 of between about 60 and 100 nm. Since the etch selectivity between SOC to Si is 10:1, the topmost Si layer 26 should be increased slightly for the additional Si/SOC stack spin-coated on the first stack. This slight Si hard mask thickness increase does not require increasing the photoresist thickness.

The thicker hybrid hard mask 30B will support a thicker metal hard mask of 100 to 150 nm and/or a thicker MTJ of 30 to 50 nm. This is because of the thicker hybrid hard mask's integrity; that is, every single layer within the stack can still be preserved after the whole stack is etched. Therefore, even for the thicker metal hard mask of 100¬150 nm for the MTJ, this ultra thick hard mask stack is capable of providing enough protection.

A photoresist pattern 25 with size d1 of between about 70 and 80 nm and thickness h1 of between about 150 and 200 nm is then patterned by photolithography on top of the hybrid hard mask stack 30A or 30B, as shown in FIGS. 1A and 1B, respectively.

Figure 2:
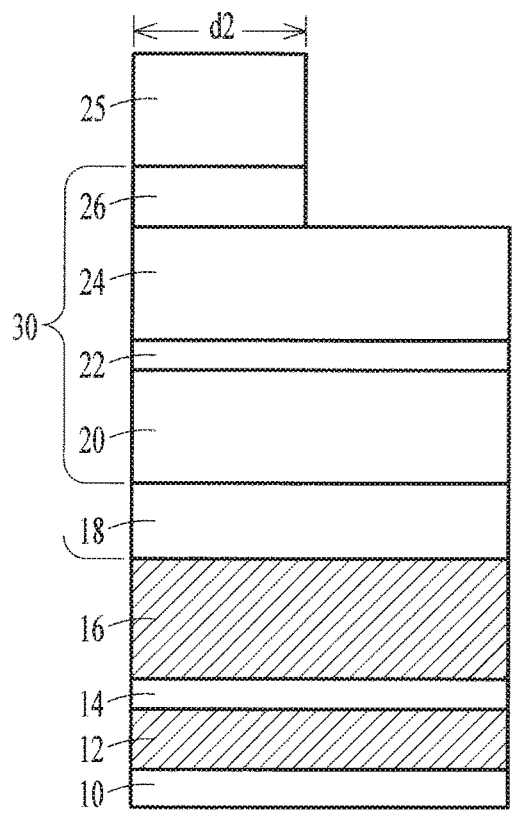
FIGS. 2 through 4 illustrate in cross-sectional representation steps in a preferred embodiment of the present disclosure.
Figure 3:
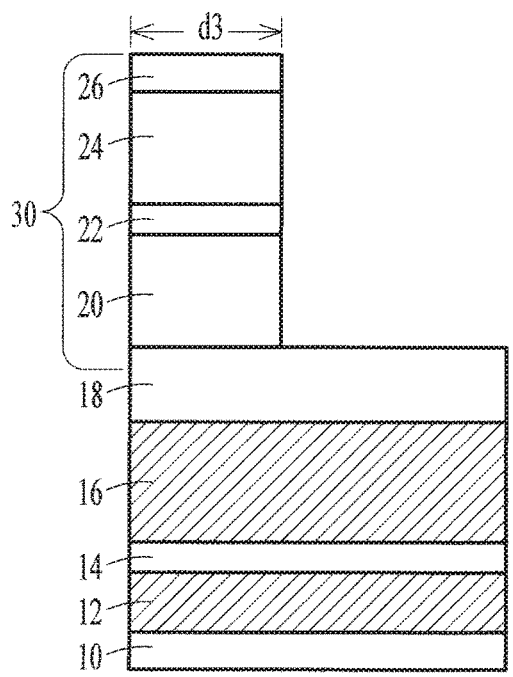
Figure 4:
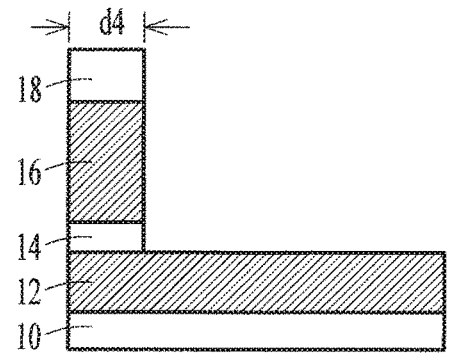

FIGS. 2-4 illustrate steps in the process of fabricating MTJ structures using hybrid hard mask 30A. It will be understood that thicker hybrid hard mask 30B of the second preferred embodiment will be used in the same way as hybrid hard mask 30A.

As shown in FIG. 2, during the first RIE etch, the top silicon hard mask 26 is firstly etched by a fluorine carbon based plasma such as CF4, CHF3 or C4F8. This will reduce the pattern size d2 to between about 60 and 70 nm. 02 can be added to the plasma to greatly reduce the pattern size to between about 40 and 50 nm.

As illustrated in FIG. 3, the remaining hybrid hard mask stack 30A having the spin-on carbon layer 24 as the topmost layer is etched in a second etching step by 02 mixed with a halogen such as Cl2 and/or HBr, thus reducing the pattern size to d3 of between about 30 and 40 nm. Adding the halogen etches away the thin Si layer between the carbon layers. Normally, the IC industry uses pure 02 or 02 mixed with a very low flow of halogen to etch SOC. This gives almost infinite selectivity between SOC and the Si hard mask above, but cannot etch away the thin Si hard mask between the different SOC layers. It is noted here that by optimizing the gas species ratio and the source and bias powers, we can achieve an etch selectivity that matches this effective portion's composition as shown in Table 1. This ensures that the whole hybrid stack is etched with great integrity. The optimal gas species ratio of halogen:02 in a ratio of 1:1, with gas flow of 50 to 100 sccm, source power of 200 to 400 watts, and bias power of 20 to 100 watts.

TABLE 1

| Material | Etch rate (A/s) | Etch selectivity | Hybrid hard mask's effective portion's composition |
|---|---|---|---|
| Spin-on carbon | 25 | 9.6:1 | 10:1 |
| Spin-on silicon | 2.6 | | |

During this second etching step, the photoresist 25 is removed along with some thickness of the topmost silicon hard mask layer 26. This is why the topmost silicon hard mask layer is thicker than the silicon hard mask layers between the carbon hard mask layers.

The final pattern size after the metal hard mask and MTJ etch is reduced to d4 of between about 15 and 20 nm, as shown in FIG. 4. The metal hard mask 16 is intact during the etch process due to the protection of the thick hybrid hard mask 30A; that is, all or most of the metal hard mask thickness remains after the etching processes are completed. At this point, almost all of the hybrid hard mask 30A will have been removed. If any remains, it can be removed after the MTJ etch. The remaining SiON layer 18 is removed by chemical mechanical polishing (CMP) or a similar process after MTJ etch and encapsulation.

In an experimental comparison, a 55 nm Ta layer was formed on a TEOS layer. When the Ta layer was patterned using a SiON hard mask under a single SOC layer, the SiON layer was completely etched away and the remaining Ta pattern had a height of about 35 nm. When the Ta layer was patterned using a SiON hard mask under the hybrid mask as shown in FIG. 2, SiON remained on top of the Ta layer and the Ta pattern still had a height of 55 nm.

The process of the present disclosure can create sub 60 nm MTJ cell size with a large metal hard mask/top electrode thickness of greater than 50 nm by introducing an ultra-thick spin-coated hybrid hard mask. That is, the hard mask layer remaining has a second thickness no less than 80% of the first as-deposited thickness. With this process, hard mask effective total thickness is no longer limited by the spin-coating RPM. The process margin, device yield, and uniformity can be improved by this method. The MTJ device and overlying top electrode can have a MTJ pattern size of between about 20 and 30 nm.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:
1. A method comprising:
   forming a stack of magnetic tunnel junction (MTJ) layers over a substrate;
   forming a metal hard mask layer on the stack of MTJ layers;
   forming a dielectric layer on the metal hard mask layer;
   forming a hybrid mask layer on the dielectric layer, wherein the hybrid mask layers includes:
      a first carbon-containing layer;
      a first silicon-containing layer disposed on the first carbon-containing layer, the first silicon-containing layer having a first thickness;
      a second carbon-containing layer disposed on the first silicon-containing layer; and
      a second silicon-containing layer disposed on the second carbon-containing layer, the second silicon-containing layer having a second thickness that is different than first thickness;
   patterning the second silicon-containing layer via a first process;
   patterning the second carbon-containing layer, the first silicon-containing layer and the first carbon-containing layer via a second process; and
   patterning the dielectric layer, the metal hard mask layer and the stack of MTJ layers via a third process.
2. The method of claim 1, wherein the second thickness is greater than the first thickness.
3. The method of claim 1, wherein the first process is a first etching process and the second process is a second etching process that is different from the first etching process.
4. The method of claim 1, wherein the first process includes performing a reactive ion etching process.
5. The method of claim 4, wherein the reactive ion etching process includes a fluorine carbon based plasma.

6. The method of claim 5, wherein the fluorine carbon based plasma includes a material selected from the group consisting of $CF_4$, $CHF_3$ and $C_4F_8$.
7. The method of claim 5, wherein the reactive ion etching process further includes $O_2$ added to the fluorine carbon based plasma.
8. The method of claim 1, wherein the second process includes etching with $O_2$ mixed with a halogen gas.
9. The method of claim 8, wherein the $O_2$ and the halogen gas are flowed at a rate from about 50 sccm to about 100 sccm, under a source power from about 200 watts to about 400 watts, and under a bias power from about 20 watts to about 100 watts.
10. A method comprising:
    forming a stack of magnetic tunnel junction (MTJ) layers;
    forming a metal hard mask layer on the stack of MTJ layers;
    forming a hybrid mask layer on the metal hard mask layer, wherein the hybrid mask layers includes one or more carbon-containing layers and one or more silicon-containing layers;
    etching, using a first etchant, one of the silicon-containing layers from the one or more silicon-containing layers;
    etching, using a second etchant, one of the carbon-containing layers from the one or more carbon-containing layers, the second etchant being different from the first etchant; and
    etching the metal hard mask layer and the stack of MTJ layers.
11. The method of claim 10, wherein the first etchant includes fluorine and the second etchant includes a halogen.
12. The method of claim 11, wherein the fluorine includes a material selected from the group consisting of $CF_4$, $CHF_3$ and $C_4F_8$, and
    wherein the halogen includes a material selected from the group consisting of $Cl_2$ and HBr.
13. The method of claim 10, wherein the etching, using the second etchant, of the one of the carbon-containing layers from the one of more carbon-containing layers includes etching another one of the silicon-containing layers from the one or more silicon-containing layers.
14. The method of claim 10, further comprising forming a dielectric layer directly on the metal hard mask layer, the dielectric layer including SiON, and
    wherein the etching of the metal hard mask layer and the stack of MTJ layers includes etching the dielectric layer.
15. The method of claim 10, further comprising performing a chemical mechanical polishing process on to remove a remaining portion of the dielectric layer after the etching of the dielectric layer.
16. The method of claim 10, wherein the metal hard mask layer includes a material selected from the group consisting of Ta, Ti, TaN and TiN.
17. A method comprising:
    forming a stack of magnetic tunnel junction (MTJ) layers;
    forming a top electrode layer directly on the stack of MTJ layers;
    forming a dielectric layer directly on the metal hard mask layer;
    spin coating a first carbon-containing layer directly on the dielectric layer;
    spin coating a first silicon-containing layer directly on the first carbon-containing layer;
    spin coating a second carbon-containing layer directly on the first silicon-containing layer;

spin coating a second silicon-containing layer directly on the second carbon-containing layer;

etching, via a first etching process, the second silicon-containing layer;

etching, via a second etching process, the second carbon-containing layer, the first silicon-containing layer and the first carbon-containing layer, the second etching process being different than the first etching process; and etching, via a third etching process, the dielectric layer, the top electrode layer and the stack of MTJ layers.

18. The method of claim 17, wherein after spin coating the first silicon-containing layer directly on the first carbon-containing layer, the first silicon-containing layer has a first thickness, and wherein after spin coating the second silicon-containing layer directly on the second carbon-containing layer, the second silicon-containing layer has a second thickness that is greater than the first thickness.

19. The method of claim 17, further comprising forming a bottom electrode layer over a substrate, and wherein the forming of the stack of MTJ layers includes forming the stack of MTJ layers directly on the bottom electrode.

20. The method of claim 17, wherein the stack of MTJ layers includes a seed layer, a pinned layer, a barrier layer, a free layer, and a cap layer.

\* \* \* \* \*